United States Patent
Kashem et al.

(10) Patent No.: US 11,947,833 B2
(45) Date of Patent: Apr. 2, 2024

(54) METHOD AND APPARATUS FOR TRAINING MEMORY

(71) Applicant: Advanced Micro Devices, Inc., Santa Clara, CA (US)

(72) Inventors: Anwar Kashem, Boxborough, MA (US); Craig Daniel Eaton, Austin, TX (US); Pouya Najafi Ashtiani, Munich (DE); Tsun Ho Liu, Boxborough, MA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/845,922

(22) Filed: Jun. 21, 2022

(65) Prior Publication Data
US 2023/0409232 A1 Dec. 21, 2023

(51) Int. Cl.
*G06F 3/06* (2006.01)
*G06F 18/214* (2023.01)

(52) U.S. Cl.
CPC .......... *G06F 3/0656* (2013.01); *G06F 3/0683* (2013.01); *G06F 18/214* (2023.01); *G06F 3/0604* (2013.01)

(58) Field of Classification Search
CPC .... G06F 3/0656; G06F 18/214; G06F 3/0683; G06F 3/0604; G06F 11/22; G06F 11/263
See application file for complete search history.

(56) References Cited

U.S. PATENT DOCUMENTS

| | | | |
|---|---|---|---|
| 9,653,180 B1 * | 5/2017 | Yang | G11C 7/10 |
| 9,886,987 B1 * | 2/2018 | Brahmadathan | G11C 29/56012 |
| 10,067,718 B2 * | 9/2018 | Covington | G06F 3/0659 |
| 10,437,512 B2 * | 10/2019 | Zhu | G06F 11/1428 |

* cited by examiner

*Primary Examiner* — Idriss N Alrobaye
*Assistant Examiner* — Richard B Franklin
(74) *Attorney, Agent, or Firm* — Volpe Koenig

(57) ABSTRACT

A method and apparatus for training data in a computer system includes reading data stored in a first memory address in a memory and writing it to a buffer. Training data is generated for transmission to the first memory address. The data is transmitted to the first memory address. Information relating to the training data is read from the first memory address and the stored data is read from the buffer and written to the memory area where the training data was transmitted.

18 Claims, 4 Drawing Sheets

METHOD AND APPARATUS FOR TRAINING MEMORY

BACKGROUND

Dynamic Random-Access Memory (DRAM) usage involves sending signals between the DRAM and a memory interface at specified timings and voltage levels. To reliably interface with the DRAM, tuning voltage offsets and relative arrival times of signals with respect to each pin on the DRAM is required. Such tunings are done to compensate for differences in trace length between pins on the accessing processing unit and pins on the DRAM and to compensate for manufacturing variation in the DRAM and a processing unit accessing the DRAM.

BRIEF DESCRIPTION OF THE DRAWINGS

A more detailed understanding can be had from the following description, given by way of example in conjunction with the accompanying drawings wherein.

DETAILED DESCRIPTION

Figure 1:
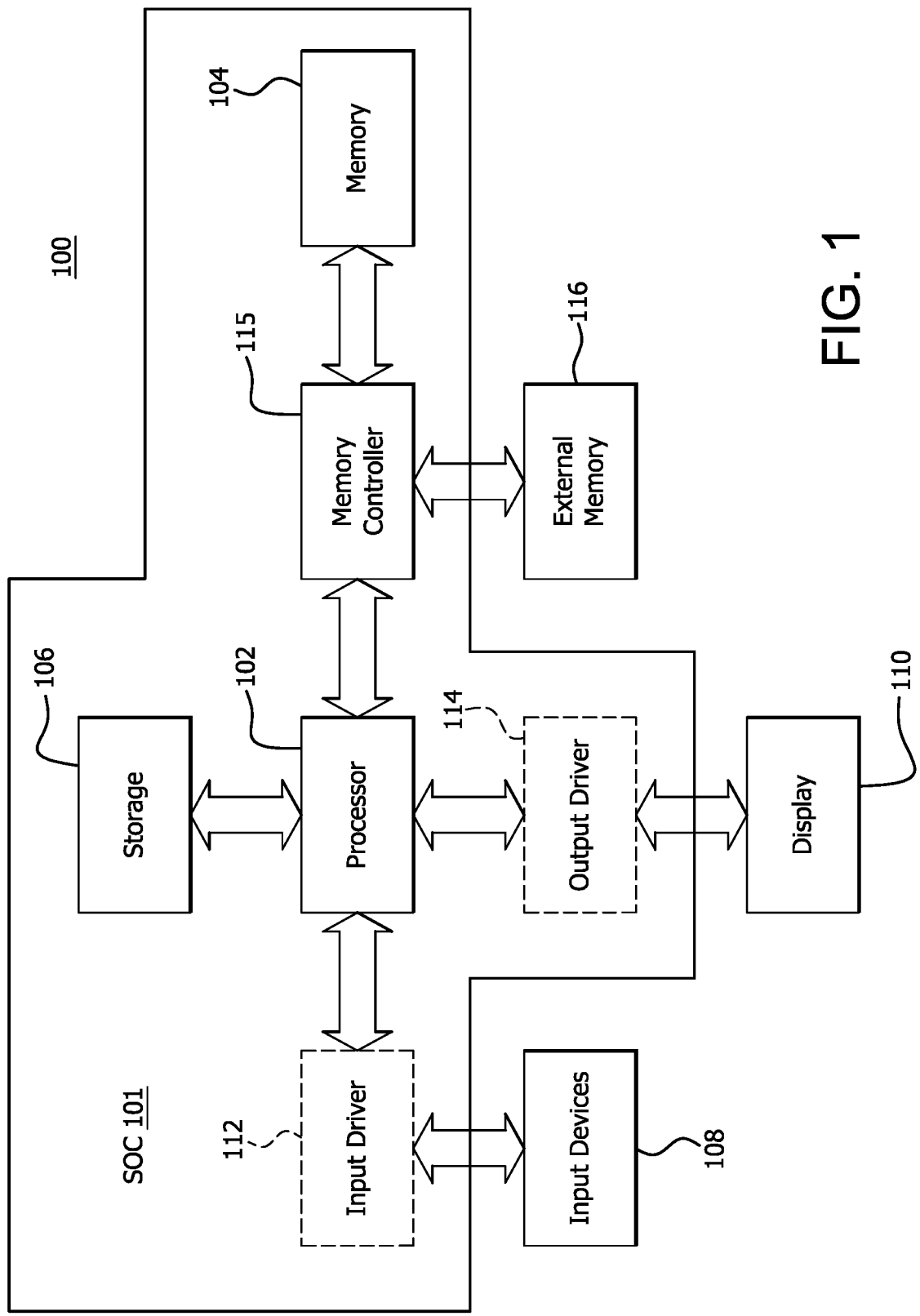
FIG. 1 is a block diagram of an example device in which one or more features of the disclosure can be implemented.

As mentioned above, Dynamic Random-Access Memory (DRAM) usage involves sending signals between the DRAM and the memory interface at specified timings and voltage levels. To reliably interface with the DRAM, tuning voltage offsets and relative arrival times of signals with respect to each pin on the DRAM is required. Such tunings are done to compensate for differences in trace length between pins on the accessing processing unit and pins on the DRAM and to compensate for manufacturing variation in the DRAM and the accessing processing unit. Thus, the searching space for the correct values of voltage offsets and timing delays for each pin of the DRAM may be large given the number of pins (e.g., 144) and the number of possible values (e.g., 256) for voltage offsets and timing delays. Manufacturing ranges and tolerances may limit the searching space so that techniques may be implemented by a smaller number of hardware components.

However, modern DRAM technologies and the diverse computing environments in which these DRAMs operate may require training to take place to secure high performance. Further, users often desire that a device (e.g., a laptop or any other mobile device) will boot or will initialize almost immediately.

Additionally, training is often required to be done periodically as the computing environment changes. Therefore, training operations are limited to a time budget. Hence, given the diversity in DRAM technologies and computing environments and given constraints on training time, training algorithms that are flexible, robust, and efficient, may be useful.

Although the method and apparatus will be expanded upon in further detail below, briefly a method and apparatus for training memory is described herein. A data buffer is operationally coupled to a physical memory link. A memory trainer, or refrainer, may operate after booting of a device or also during operation while other software is running. The memory trainer selects a memory address with which to perform memory retraining and causes the contents of memory at that address to be written to the buffer. The memory trainer then performs memory training by writing to that address and observing the result. When memory retraining is complete, the memory trainer causes the data from the buffer to be rewritten to the memory address.

Further, although described in further detail below, an SOC is a device where many components of an entire system are resident on a chip. For example, an SOC may include a processor, memory, storage, input and output drivers, and other components on a single chip.

A method for training data in a computer system includes reading data stored in a first memory address in a memory and writing it to a buffer. Training data is generated for transmission to the first memory address. The data is transmitted to the first memory address. Information relating to the training data is read from the first memory address and the stored data is read from the buffer and written to the memory area where the training data was transmitted.

An apparatus for training a memory area in a computer system includes a memory and a processor operatively coupled to and in communication with the memory. The processor is configured to read first data stored in a first memory address in the memory and write the first data to a buffer, generate training data for transmission to the first memory address, transmit the training data to the first memory address, read information relating to the training data from the first memory address, and read the first data from the buffer and write the first data to the first memory address where the training data was transmitted based upon the information relating to the training data.

A non-transitory computer-readable medium for training a memory area in a computer system, the non-transitory computer-readable medium having instructions recorded thereon, that when executed by the processor, cause the processor to perform operations. The operations include reading first data stored in a first memory address in a memory and writing the first data to a buffer, generating training data for transmission to the first memory address, transmitting the training data to the first memory address, reading information relating to the training data from the first memory address, and reading the first data from the buffer and writing the first data to the first memory address where the training data was transmitted based upon the information relating to the training data.

FIG. 1 is a block diagram of an example device 100 in which one or more features of the disclosure can be implemented. The device 100 can include, for example, a computer, a server, a gaming device, a handheld device, a set-top box, a television, a mobile phone, or a tablet computer. The device 100 includes a processor 102, a memory 104, a storage 106, one or more input devices 108, and one or more output devices 110. For purposes of example, the output device 110 is shown as being a display 110, however, it is understood that other output devices could be included.

The device 100 can also optionally include an input driver 112 and an output driver 114. Additionally, the device 100 includes a memory controller 115 that communicates with the processor 102 and the memory 104, and also can communicate with an external memory 116. In some embodiments, memory controller 115 will be included within processor 102 It is understood that the device 100 can include additional components not shown in FIG. 1.

As discussed above, the processor 102, memory 104, storage 106, input driver 112, output driver 114 and memory controller 115 may be included on an SOC 101. Additionally, the memory controller 115 may include a processor, or processing circuitry, for performing operations.

In various alternatives, the processor 102 includes a central processing unit (CPU), a graphics processing unit (GPU), a CPU and GPU located on the same die, or one or more dies, wherein each processor die can be a CPU or a GPU. In various alternatives, the memory 104 is located on the same die as the processor 102, or is located separately from the processor 102. The memory 104 includes a volatile or non-volatile memory, for example, random access memory (RAM), dynamic RAM, or a cache.

The storage 106 includes a fixed or removable storage, for example, a hard disk drive, a solid state drive, an optical disk, or a flash drive. The input devices 108 include, without limitation, a keyboard, a keypad, a touch screen, a touch pad, a detector, a microphone, an accelerometer, a gyroscope, a biometric scanner, or a network connection (e.g., a wireless local area network card for transmission and/or reception of wireless IEEE 802 signals). The output devices 110 include, without limitation, a display, a speaker, a printer, a haptic feedback device, one or more lights, an antenna, or a network connection (e.g., a wireless local area network card for transmission and/or reception of wireless IEEE 802 signals).

The input driver 112 communicates with the processor 102 and the input devices 108, and permits the processor 102 to receive input from the input devices 108. The output driver 114 communicates with the processor 102 and the output devices 110, and permits the processor 102 to send output to the output devices 110. It is noted that the input driver 112 and the output driver 114 are optional components, and that the device 100 will operate in the same manner if the input driver 112 and the output driver 114 are not present.

The external memory 116 may be similar to the memory 104, and may reside in the form of off-chip memory. Additionally, the external memory may be memory resident in a server where the memory controller 115 communicates over a network interface to access the external memory 116. For example, the external memory may be a dynamic random access memory (DRAM) that is external to the SOC 101. In addition, the external memory 116 may be external to the system 100.

Figure 2:
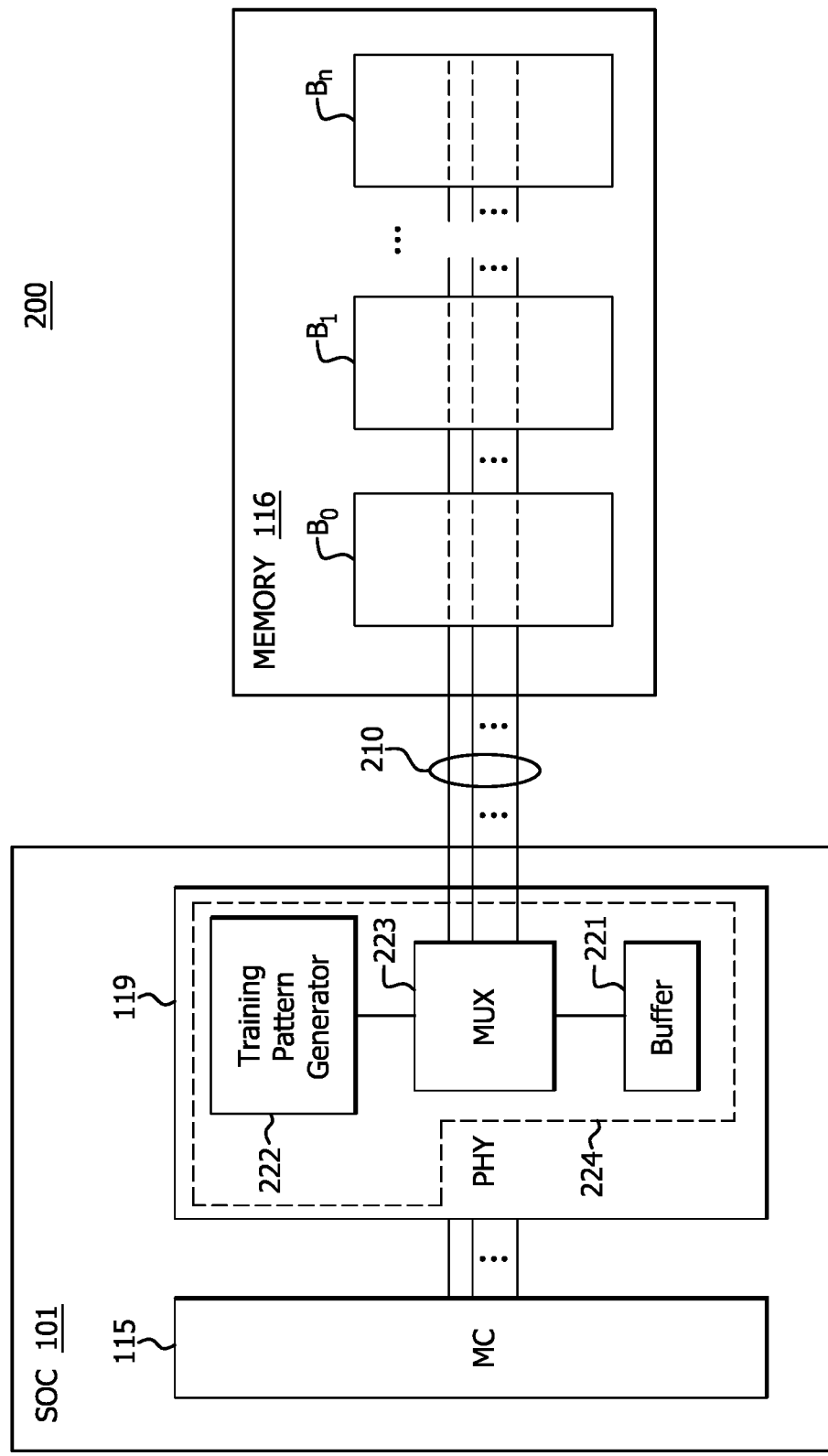
FIG. 2 is a block diagram of a portion of the example system of FIG. 1.

FIG. 2 is a block diagram of a portion of the example system 100 of FIG. 1. In particular, FIG. 2 shows the memory controller 115 (designated, for example, as MC and a physical layer circuitry (PHY) 119 as part of the SOC 101. The PHY 119 is in communication with memory banks of external memory 116 (e.g., DRAM designated $B_0, B_1, \ldots,$ B 1). The MC 115 controls data flows to the PHY 119, which then effects reads and writes to the memory banks of the memory 104 over bus wires 210.

Additionally, the PHY 119 includes a buffer 221 for storing data, a training pattern generator 222, and a multiplexer (MUX) 223. The data stored in buffer 221 may be utilized for analysis during memory training. Additionally, the buffer 221 may be used to store data from the memory banks B in the memory 116.

The training data may be generated by the training pattern generator 222 which is in communication with the MUX 223. The training pattern generator 222 may be circuitry. Additionally, the training pattern generator may be controlled by software or by the MC 115. Collectively, the buffer 221, training pattern generator 22, and MUX 223 operate as a memory trainer 224. The memory trainer 224 can be dedicated hardware, circuitry, software, or a combination thereof. Additionally, although the memory trainer 224 is shown as residing in the PHY 119, it should be noted that the memory trainer 224, or various components could reside elsewhere, (e.g., MC 115).

The MUX 223 in PHY 119 multiplexes data between the PHY 119 and the Memory 116. Accordingly, MUX 223 allows for data to be written to, or read from selected areas of memory in the memory banks B. This data transmission may be performed by effecting a read or a write along the bus wires 210 based upon the area of memory in memory banks $B_0, B_1, \ldots, B_n$ that is to be trained.

That is, each of the bus wires 210 communicates from the PHY 119 to the memory banks B of the external memory 116 through the MUX 223 to allow data to be written to the memory banks B when a command to write data is received by the PHY 119. In addition, each of the bus wires 210 allows data to be transmitted back from the memory banks B to the PHY when a command to read data is received by the PHY 119.

Although the memory controller 115 is shown as communicating with the external memory 116 (DRAM), it should be noted that the memory controller may also be communicating in the context of the description below with memory 104 or any other memory utilized by the system 100.

As shown in FIG. 2, when an operation is requested of the PHY 119 from the memory controller 115 to perform an operation on data in the memory 116, for example, a signal is sent by the memory controller 115 to the PHY 119 to perform the operation. For example, when a read or write operation is passed to the PHY 119 from the MC 115, the PHY 119 transmits and receives from the memory 104 over the bus wires 210.

More specifically, referring back to FIGS. 1 and 2 together, when a command is sent by the memory controller 115 to perform a read or write operation, the memory controller 115 passes the command to the PHY 119 for actual transmission or reception of the data. Each of the bus wires 210 is connected to the memory banks B and the PHY 119 allows the data to be transmitted to one or more of the memory banks B depending on the need of the read or write operation.

As discussed previously, each bus wire 210 transmits/carries information independently to one another. The MUX 223 allows for information to be multiplexed from the PHY 119 to any of the bus wires 210 to read and write data to any location within the memory banks B of the memory 116.

In this manner, data can be examined in any area of the memory banks B. That is, information can be read through the MUX 223 from, for example, a memory location in bank $B_1$ and stored in the buffer 221. Additionally, data (e.g., training data) can be written from the training pattern generator 222, and multiplexed through the MUX 223 to any memory location in the memory banks B (e.g., $B_0$, $B_1, \ldots, B_n$).

Figure 3:
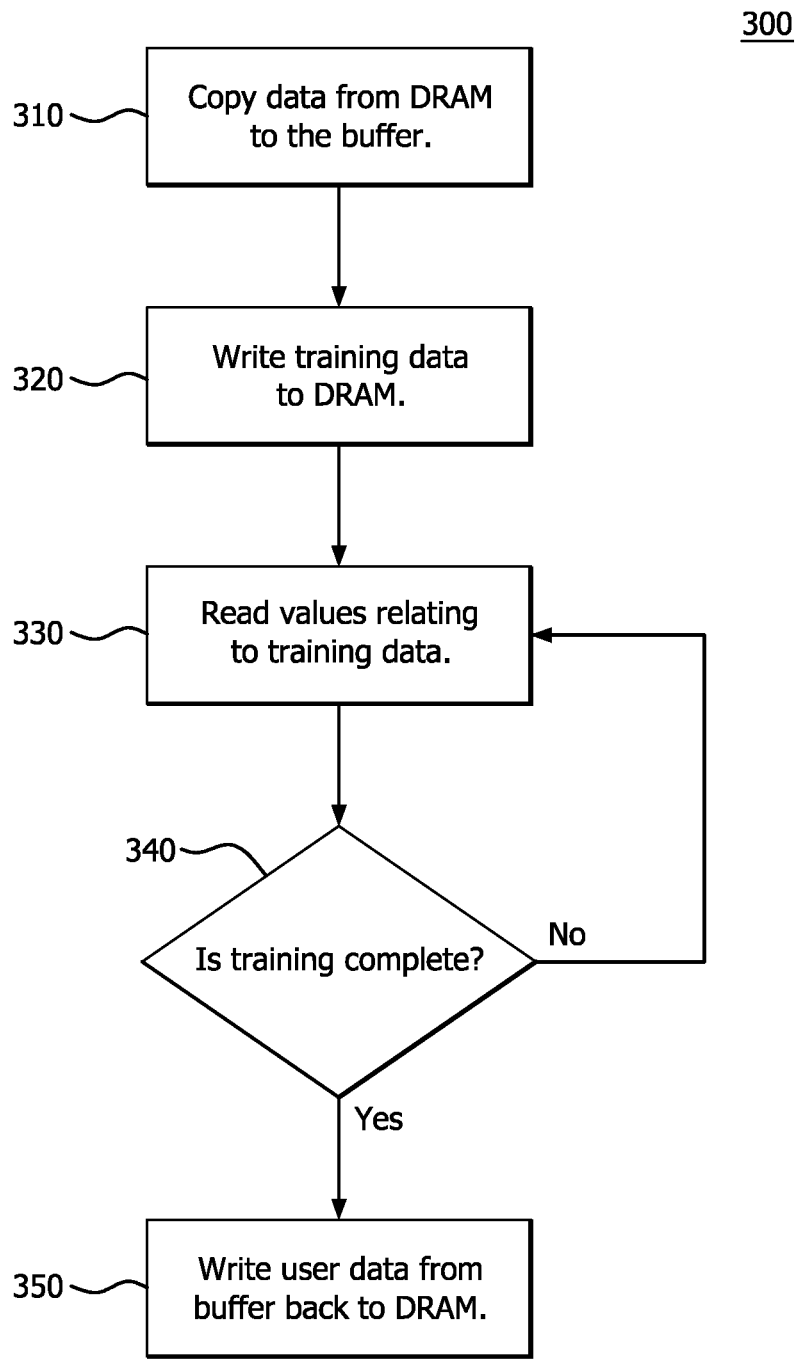
FIG. 3 is a flow diagram of an example method for training memory in accordance with an embodiment.

FIG. 3 is a flow diagram of an example method 300 for training memory in accordance with an embodiment. In step 310, data (e.g., user data) is copied from the DRAM (e.g., memory 116) to the buffer 221. This copied data may be user data, which could otherwise be lost or corrupted during memory training if not copied. For example, if the user data is not copied and the training of the memory area with training data causes a corruption, then the user data may be lost if it was not read out from the memory area it is stored in on the DRAM.

Accordingly, once it is determined a memory area to train or re-train, any data that is stored in that memory area is copied from the memory area (e.g., by the MC 115) in the data bank of memory 116 through the MUX 223 and stored in the buffer 221. That data is stored in the buffer 221 until the training sequence is completed. An example of this technique is described below in FIG. 4.

Further, the memory area read can be a read from any programmable or algorithmically generated address in the memory. Since the same data will be written back from the contents of the buffer 221 to the same memory address in the DRAM, any memory address can be selected. This approach is also transparent to the operating system or other end applications.

Training data is then written to the memory area of the DRAM (step 320). For example, the training pattern generator 222 generates training data, which is transferred by the MC 115 through the PHY 119 and MUX 221 to the area of memory in memory 116 being trained.

As will be described in additional detail below, the training data may be any data generated by the training pattern generator 222. That data is then known for comparison upon, for example, a read back from the area of memory being trained. Accordingly, the training data can be utilized to determine whether or not there is a problem with the memory area being trained.

In step 330, therefore, the values relating to the training data are read. These values may be read by the MC 115 or the CPU 102 in order to determine whether or not the area of memory being trained is corrupted or otherwise unusable. The data may be read during readback from the memory area. The values may determine whether or not the memory area is suitable for use.

For example, the training data may be compared as it is read to what the system (e.g., via the MC 115 or CPU 102) knows the training data to be. Additional data may be read (e.g., via sensors not shown) relating to the offset voltages or temperatures on the bus wires and compared to predefined voltages or temperatures to determine if a read and a write during training to a memory area is within a pre-defined parameter.

Additionally, timing delays relating to the transmission of the training data may be read as the values. For example, the timing delay for a read or write of the training data may be compared to a predefined timing delay. If the timing delay of the read or write is within the predefined timing delay, the memory area may be considered trained and usable. If the timing delay is outside of the predefined delay, the memory address area may be considered unusable.

If the training data in step 330 is determined to be correct, then the memory area may be trained and maintained for use to write data. For example, when comparing the read back training data to the training data that is known to be the correct training data, if the two data compare, the memory area may be valid for use.

In the case of the above where the memory area in the DRAM is determined to be usable, the system can then write back the user data in step 350 below when training is complete. If the training data for some reason is not comparable to the training data known to be the correct training data, then the memory area may be determined as unusable. In this case, user data is not written back to the memory area being trained in step 350 below. In this case, the user data may be written to another memory address area.

If the training is not complete (step 340), then the method reverts to step 330. However, if the training is complete in step 340, then the user data is written back to the memory area (step 350). It should be noted however, that as described above, it may not be desirable to write the user data back to a memory area that appears to be unusable during training.

Figure 4A:
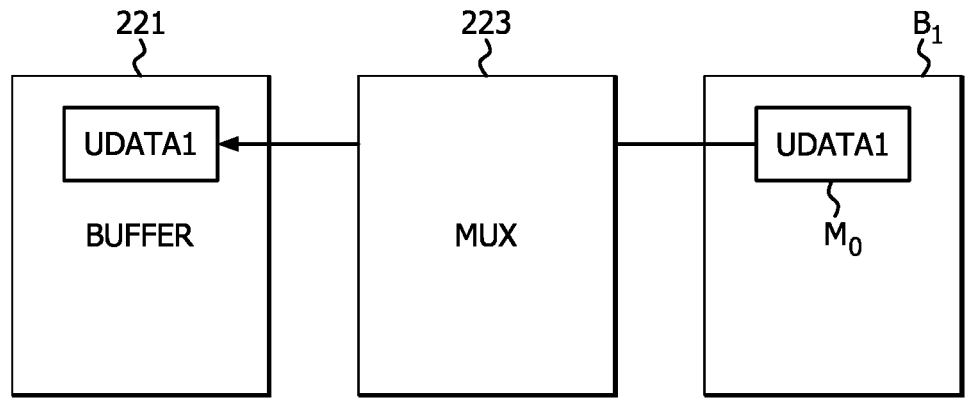
FIGS. 4A-4C are block diagrams of training memory in accordance with the method of FIG. 3.
Figure 4B:
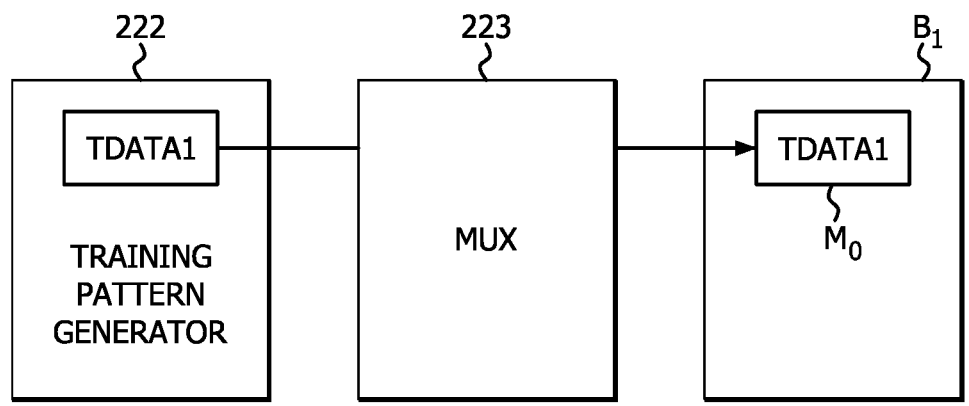
Figure 4C:
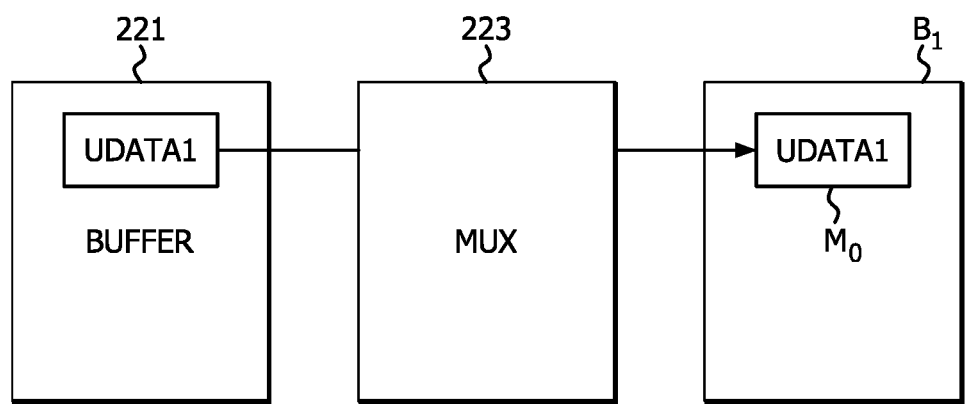

FIGS. 4A-4C are block diagrams of training memory in accordance with the method of FIG. 3. FIG. 4A depicts a process of copying user data (e.g. udata1) from an area of memory. FIG. 4B depicts a process of writing training data (e.g. tdata1) to the area of memory to be trained. FIG. 4C depicts writing the user data back to the memory area once the memory area is trained.

Accordingly, referring to FIG. 4A and also back to step 310 of FIG. 3, user data (udata1) is stored in an area of DRAM memory (e.g., memory 116). This udata1 may be any type of data utilized by a user. For example, it may be data relating to an application that the user is working on or data that is required to execute a program the user is executing.

As shown in FIG. 4A, the udata1 is stored in a memory area (designated $M_0$) in memory bank $B_1$ of the memory 116, for example. During step 310 of the method 300, the udata1 is to be extracted, or read, out of the memory area $M_0$ so that memory area $M_0$ can be trained. In the case shown in FIG. 4A, the area of memory $M_0$ to be trained is in memory bank $B_1$. Accordingly, udata1 is copied from memory area $M_0$ through the MUX 223 and stored in buffer 221 of the PHY 119.

FIG. 4B depicts training data being written to the memory area being trained. For example, as shown in FIG. 4B, training data (tdata1) is generated by the training pattern generator 222. This tdata1 may be any type of training data used to train a memory area. The training data is then written to the memory area $M_0$ of memory bank $B_1$ of the memory 116. The training data is multiplexed through the MUX 223 in order have it written to the memory area in the memory bank.

Since the hardware or software knows the contents of the training data, upon read out from memory area $M_0$ of memory bank $B_1$, it can be determined if the memory area is trained or if there is a problem with it. For example, if the tdata1 matches the known generated tdata1 upon readout, it may be determined that the memory area $M_0$ is trained since the tdata1 is uncorrupted.

FIG. 4C depicts writing user data back to the memory area after training. In FIG. 4C, the user data (udata1) is stored in the buffer 221 of the PHY 119. As mentioned above relating to FIG. 4A, the user data that is stored in the buffer 221 is the user data read out from memory area $M_0$ of the memory bank $B_1$. Once training of the memory area is complete, it is necessary to write that user data back to the memory area where it was stored.

Accordingly, as shown in FIG. 4C, the user data (udata1) that is being stored in the buffer is written back to memory area $M_0$ of the memory bank $B_1$. The user data is multiplexed through the MUX 223 in order to write it back to the proper memory area in the DRAM (e.g., memory 116). Therefore, once memory area $M_0$ of the memory bank $B_1$ is trained, and the user data (udata1) is written back to the memory area for use, a user application can access the data where it is expected the user data will be.

Although the buffer 221 is shown to be resident in the PHY 119, it should be noted that the buffer 221 may reside in other areas as well. For example, the buffer could be resident in the memory controller (MC) 115. Additionally, the buffer 221 may reside in the memory training logic itself. For example, the buffer 221 may reside in the training pattern generator 222.

As mentioned above, since modern DRAM technologies and the diverse computing environments in which these DRAMs operate may require training to take place to secure high performance, and users often desire that a device (e.g., a laptop or any other mobile device) will boot or will initialize almost immediately. Accordingly, the method and apparatus described above provide for training of memory areas to be performed to satisfy user and memory technology needs.

That is, again since training is often required to be done periodically as the computing environment changes and training operations are limited to a time budget, given the diversity in DRAM technologies and computing environments and given constraints on training time, training algorithms that are flexible, robust, and efficient, may be useful. Accordingly, the above method and apparatus described, allow for memory training that can be performed periodically as the computing environment changes and while memory address areas in memory already include user data.

Further, the memory training logic may be implemented as hardware logic (e.g., circuitry) or may be a software controlled logic. In addition, the training pattern generator 222 may be implemented as hardware logic circuitry or be software controlled.

The methods provided can be implemented in a general-purpose computer, a processor, or a processor core. Suitable processors include, by way of example, a general purpose processor, a purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors can be manufactured by configuring a manufacturing process using the results of processed hardware description language (HDL) instructions and other intermediary data including netlists (such instructions capable of being stored on a computer readable media). The results of such processing can be maskworks that are then used in a semiconductor manufacturing process to manufacture a processor which implements features of the disclosure. Further, although the methods and apparatus described above are described in the context of controlling and configuring memory physical links, the methods and apparatus may be utilized in any interconnect protocol where link width is negotiated.

The methods or flow charts provided herein can be implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs). For example, the methods described above may be implemented in the processor 102 or on any other processor in the computer system 100. Additionally, the methods described above may be performed in a controller, processor or circuitry within any component (e.g., a component of the SOC 101).

What is claimed is:

1. A method for training a memory area in a computer system, comprising:
   reading first data stored in a first memory address in a memory and writing the first data to a buffer;
   generating training data for transmission to the first memory address, and transmitting the training data to the first memory address;
   reading information relating to the training data from the first memory address, the information comprising a voltage offset; and
   reading the first data from the buffer and writing the first data to the first memory address where the training data was transmitted based upon the information relating to the training data.

2. The method of claim 1 wherein the first data stored in the first memory address is user data.

3. The method of claim 1, further comprising reading the training data from the first memory address.

4. The method of claim 3 wherein reading the information relating to the training data includes comparing the training data to a known training data.

5. The method of claim 4 wherein upon the training data matching the known training data, the first memory address is trained.

6. The method of claim 5, further comprising writing the stored data from the buffer to the first memory address upon the first memory address being trained.

7. The method of claim 4 wherein upon the training data not matching the known training data, removing the first memory address from use.

8. The method of claim 7, further comprising writing the first data from the buffer to a second memory area.

9. The method of claim 1 wherein upon the voltage offset read is within a predefined parameter, the first memory address is considered trained.

10. An apparatus for training a memory area in a computer system, comprising:
    a memory;
    a processor operatively coupled to and in communication with the memory, the processor configured to:
    read first data stored in a first memory address in the memory and write the first data to a buffer;
    generate training data for transmission to the first memory address, and transmit the training data to the first memory address;
    read information relating to the training data from the first memory address, the information comprising a voltage offset; and
    read the first data from the buffer and write the first data to the first memory address where the training data was transmitted based upon the information relating to the training data.

11. The apparatus of claim 10 wherein the first data stored in the first memory address is user data.

12. The apparatus of claim 10, wherein the processor is further configured to read the training data from the first memory address.

13. The apparatus of claim 12 wherein reading the information relating to the training data includes comparing the training data to a known training data.

14. The apparatus of claim 13 wherein upon the training data matching the known training data, the first memory address is trained.

15. The apparatus of claim 14, wherein the processor is further configured to write the stored data from the buffer to the first memory address upon the first memory address being trained.

16. The apparatus of claim 13 wherein the processor is further configured to, upon the training data not matching the known training data, remove the first memory address from use.

17. The apparatus of claim 16, wherein the processor is further configured to write the first data from the buffer to a second memory area.

18. A non-transitory computer-readable medium for training a memory area in a computer system, the non-transitory computer-readable medium having instructions recorded thereon that, when executed by a processor, cause the processor to perform operations including:
- reading first data stored in a first memory address in a memory and writing the first data to a buffer;
- generating training data for transmission to the first memory address, and transmitting the training data to the first memory address;
- reading information relating to the training data from the first memory address, the information comprising a voltage offset; and
- reading the first data from the buffer and writing the first data to the first memory address where the training data was transmitted based upon the information relating to the training data.

* * * * *